(12) United States Patent
Kitano et al.

(10) Patent No.: US 12,370,674 B2
(45) Date of Patent: Jul. 29, 2025

(54) ROBOT CONTROL DEVICE, ROBOT PROVIDED WITH THE SAME, AND ROBOT SYSTEM

(71) Applicant: Kawasaki Jukogyo Kabushiki Kaisha, Kobe (JP)

(72) Inventors: Shinya Kitano, Kobe (JP); Junichi Sugahara, Kobe (JP); Keita Kikuchi, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 844 days.

(21) Appl. No.: 17/623,885

(22) PCT Filed: Jun. 29, 2020

(86) PCT No.: PCT/JP2020/025460
§ 371 (c)(1),
(2) Date: Dec. 30, 2021

(87) PCT Pub. No.: WO2021/002310
PCT Pub. Date: Jan. 7, 2021

(65) Prior Publication Data
US 2022/0410379 A1 Dec. 29, 2022

(30) Foreign Application Priority Data
Jul. 1, 2019 (JP) .................. 2019-122771

(51) Int. Cl.
*B25J 9/16* (2006.01)
*B25J 9/00* (2006.01)
(Continued)

(52) U.S. Cl.
CPC ........... *B25J 9/1602* (2013.01); *B25J 9/0081* (2013.01); *B25J 9/042* (2013.01); *B25J 9/1664* (2013.01); *B25J 11/0095* (2013.01)

(58) Field of Classification Search
CPC ........ B25J 9/1602; B25J 9/0081; B25J 9/042; B25J 9/1664; B25J 11/0095; B25J 9/04;
(Continued)

(56) References Cited

U.S. PATENT DOCUMENTS 6,960,057 B1 * 11/2005 Hofmeister ....... H01L 21/67766
414/744.5
2007/0081881 A1 * 4/2007 Okuno .............. H01L 21/67167
414/217
(Continued)

FOREIGN PATENT DOCUMENTS

EP      2045049 A2 *  4/2009  ............ B25J 9/1692
JP      2010-184333 A   8/2010
(Continued)

*Primary Examiner* — Jacob S. Scott
*Assistant Examiner* — Erin Morris
(74) *Attorney, Agent, or Firm* — XSENSUS LLP

(57) ABSTRACT

A robot control device configured to control operation of a robot configured to transfer a substrate while holding the substrate. The robot includes a robotic arm having at least one joint axis, and an end effector provided to a tip end of the robotic arm and configured to hold the substrate. A position and a posture of the end effector are defined by values of N variables. A value of at least one of the N variables that define a holding position and a holding posture of the end effector for holding the substrate placed on the installation position by the end effector is independent from a value of the corresponding variable among the N variables that define a withdrawn position and a withdrawn posture of the end effector after retreating the end effector in the holding position and the holding posture from the installation position.

6 Claims, 7 Drawing Sheets

|  | 1ST EMBODIMENT | | 2ND EMBODIMENT | | CONVENTIONAL EXAMPLE | |
|---|---|---|---|---|---|---|
|  | 1ST TEACHING POINT | 2ND TEACHING POINT | 1ST TEACHING POINT | 2ND TEACHING POINT | 1ST TEACHING POINT | 2ND TEACHING POINT |
| X DIRECTION COMPONENT | $X_1$ | $X_2$ | $X_1$ | $X_2$ | $X_1$ | $X_1 - 200$ |
| Y DIRECTION COMPONENT | $Y_1$ | $Y_2$ | $Y_1$ | $Y_1$ | $Y_1$ | $Y_1$ |
| Z DIRECTION COMPONENT | $Z_1$ | $Z_2$ | $Z_1$ | $Z_1$ | $Z_1$ | $Z_1$ |
| ANGLE BETWEEN L AND P | $\theta_1$ | $\theta_2$ | $\theta_1$ | $\theta_1$ | $\theta_1$ | $\theta_1$ |

(51) Int. Cl.
*B25J 9/04* (2006.01)
*B25J 11/00* (2006.01)

(58) Field of Classification Search
CPC .. B25J 9/1692; H01L 21/67766; H01L 21/68; H01L 21/68707; G05B 19/42; G05B 2219/36458
See application file for complete search history.

(56) References Cited

U.S. PATENT DOCUMENTS

| | | |
|---|---|---|
| 2010/0209225 A1 | 8/2010 | Matsuo et al. |
| 2011/0052349 A1* | 3/2011 | Sone ................ H01L 21/67766 414/226.01 |
| 2014/0350714 A1 | 11/2014 | Kimura et al. |
| 2017/0106533 A1 | 4/2017 | Minami et al. |
| 2024/0170322 A1* | 5/2024 | Hosek ............... H01L 21/68707 |
| 2024/0178043 A1* | 5/2024 | Sanemasa ................ B25J 19/02 |

FOREIGN PATENT DOCUMENTS

| | | | |
|---|---|---|---|
| JP | 2011-228627 A | 11/2011 | |
| JP | 2014-229757 A | 12/2014 | |
| JP | 2017-76710 A | 4/2017 | |
| JP | 2023030876 A * | 3/2023 | .......... B25J 11/0095 |

\* cited by examiner

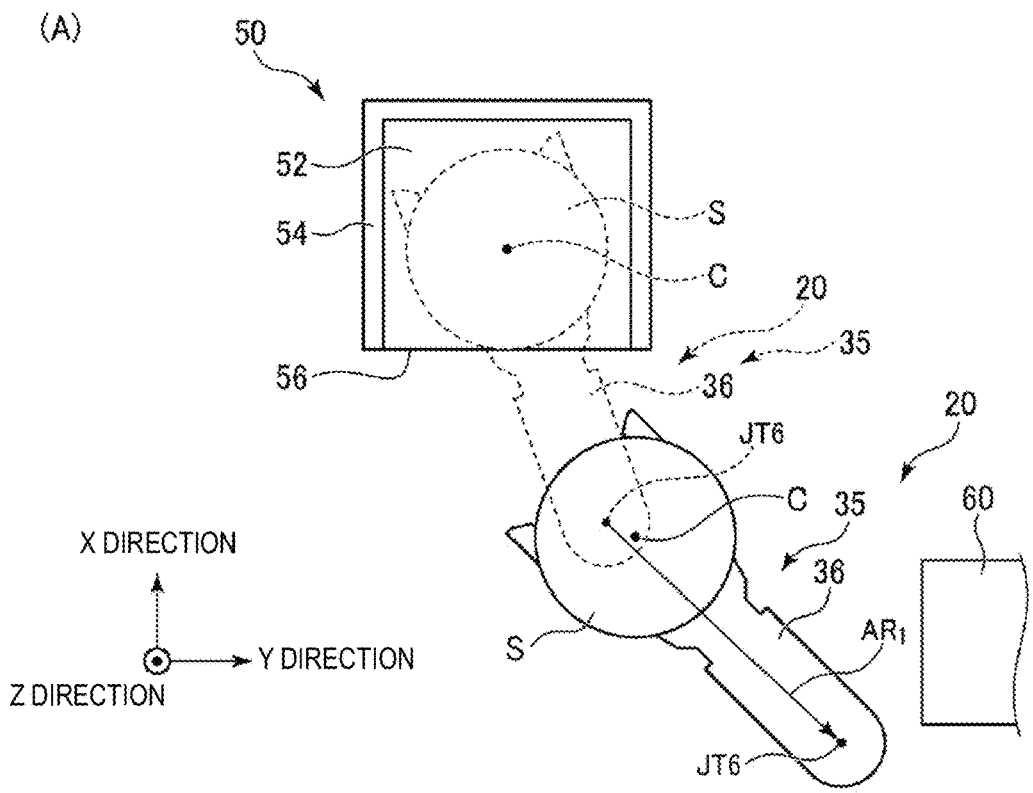
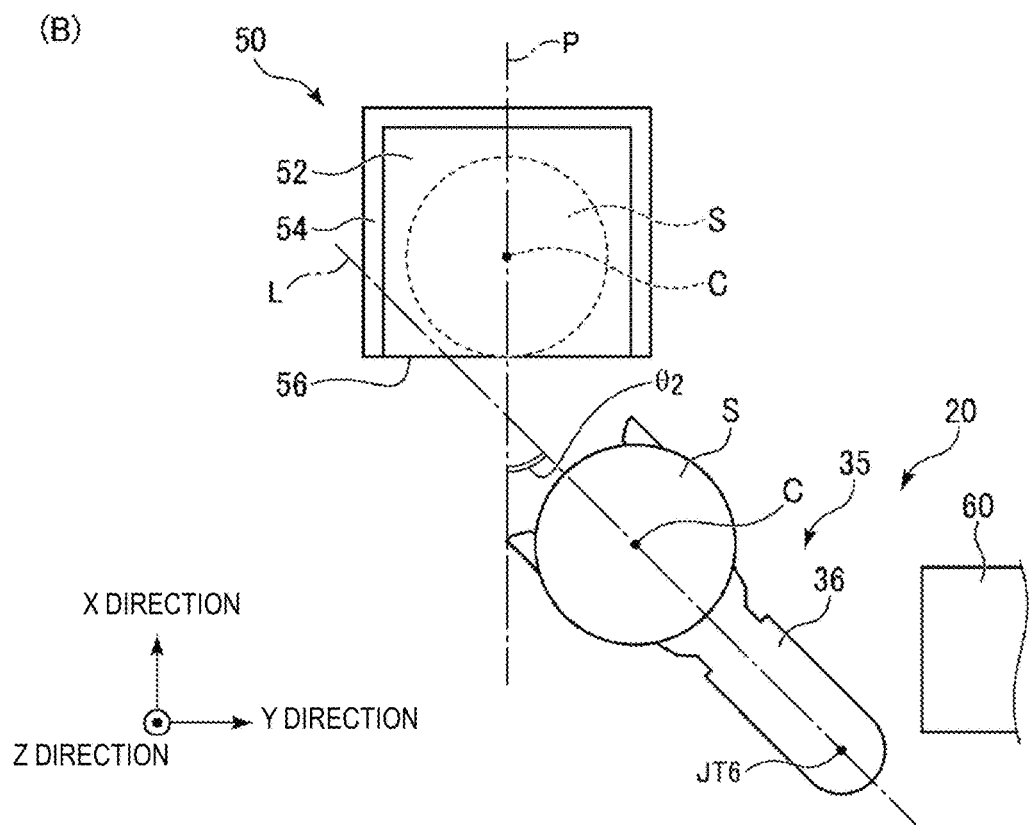
FIG. 4

| | 1ST EMBODIMENT | | 2ND EMBODIMENT | | CONVENTIONAL EXAMPLE | |
|---|---|---|---|---|---|---|
| | 1ST TEACHING POINT | 2ND TEACHING POINT | 1ST TEACHING POINT | 2ND TEACHING POINT | 1ST TEACHING POINT | 2ND TEACHING POINT |
| X DIRECTION COMPONENT | $X_1$ | $X_2$ | $X_1$ | $X_2$ | $X_1$ | $X_1$–200 |
| Y DIRECTION COMPONENT | $Y_1$ | $Y_2$ | $Y_1$ | $Y_1$ | $Y_1$ | $Y_1$ |
| Z DIRECTION COMPONENT | $Z_1$ | $Z_2$ | $Z_1$ | $Z_1$ | $Z_1$ | $Z_1$ |
| ANGLE BETWEEN L AND P | $\theta_1$ | $\theta_2$ | $\theta_1$ | $\theta_1$ | $\theta_1$ | $\theta_1$ |

FIG. 6

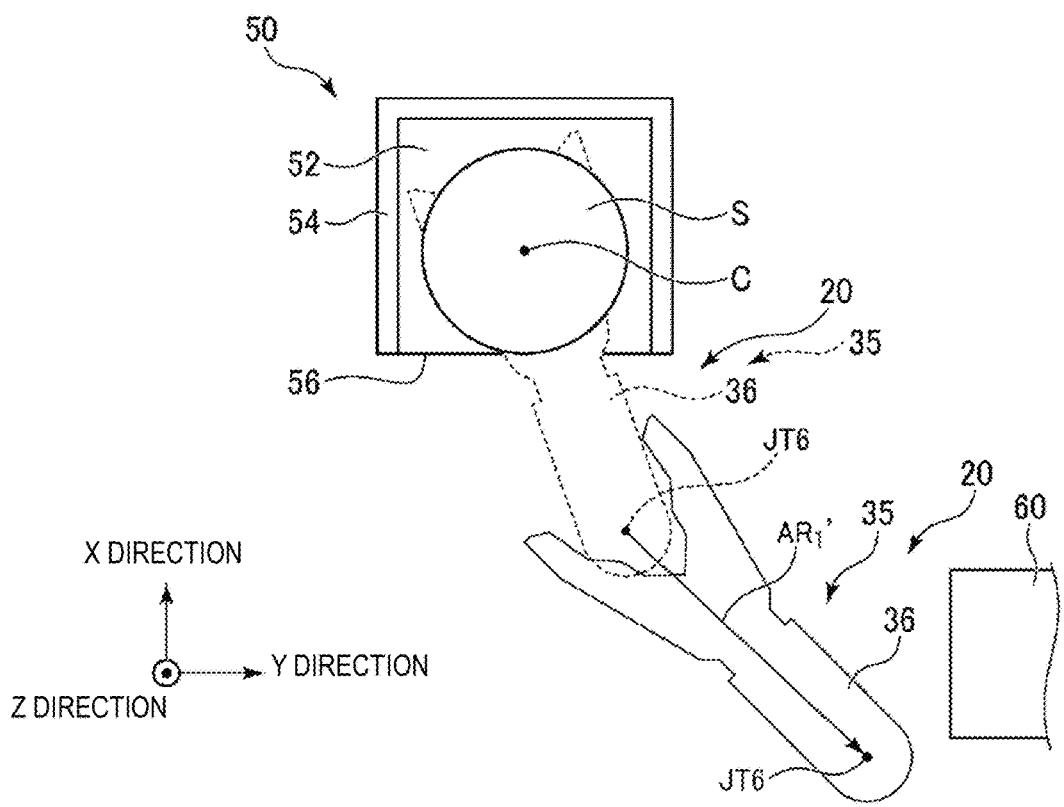
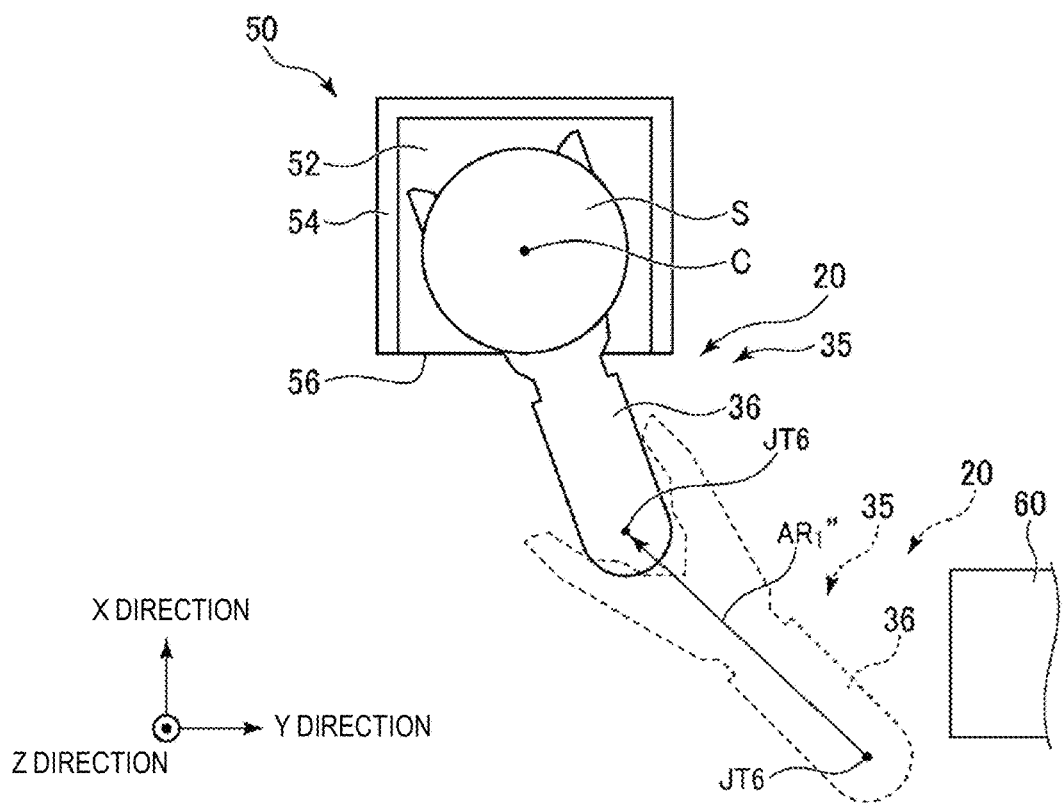
FIG. 7

ROBOT CONTROL DEVICE, ROBOT PROVIDED WITH THE SAME, AND ROBOT SYSTEM

CROSS-REFERENCE TO RELATED APPLICATIONS

The present application is based on PCT filing PCT/JP2020/025460, filed Jun. 29, 2020, which claims priority to JP 2019-122771, filed Jul. 1, 2019, the entire contents of each are incorporated herein by reference.

TECHNICAL FIELD

The present disclosure relates to a robot control device, a robot provided with the same, and a robot system.

BACKGROUND ART

Conventionally, robot control devices for controlling operation of a robot which transfers a substrate while holding the substrate are known. This kind of robot control device is proposed in Patent Document 1 as a robot for substrate transfer, for example.

In the robot for substrate transfer of Patent Document 1, when a teaching position is taught as a substrate transfer position to/from an accommodation container, a controller generates an access standby position, and, at the same time, it generates a plurality of safe transferring paths to be a minimum turn posture from the accommodation container. Note that the "access standby position" as used herein is a position generated from the teaching position, and is a position immediately before the robot for substrate transfer can start the storing or taking-out of the substrate into/from the accommodation container. The robot for substrate transfer can straightly insert the substrate into the accommodation container or take out the substrate from the accommodation container, from/to the access standby position.

REFERENCE DOCUMENT OF CONVENTIONAL ART

Patent Document

[Patent Document 1] JP2010-184333A

DESCRIPTION OF THE DISCLOSURE

Problem to be Solved by the Disclosure

Meanwhile, the robot for substrate transfer of Patent Document 1 generates the access standby position based on the teaching position which is taught as the substrate transfer position to/from the accommodation container. That is, when the teaching position taught as the substrate transfer position to/from the accommodation container is changed, the access standby position is also changed according to the change. Therefore, since the access standby position is influenced by the teaching position, there may be a case where the robot for substrate transfer cannot appropriately transfer the substrate when the access standby position is not taught correctly.

Thus, one purpose of the present disclosure is to provide a robot control device, a robot provided with the same, and a robot system, which can appropriately transfer the substrate.

SUMMARY OF THE DISCLOSURE

In order to solve the problem, a robot control device according to the present disclosure is a robot control device configured to control operation of a robot configured to transfer a substrate while holding the substrate. The robot includes a robotic arm having at least one joint axis, and an end effector provided to a tip end of the robotic arm and configured to hold the substrate. The robot is disposed adjacent to an installation position at which the substrate is placed. A position and a posture of the end effector are defined by values of N variables (N is a natural number). A value of at least one of the N variables that define a holding position and a holding posture of the end effector for holding the substrate placed on the installation position by the end effector is independent from a value of the corresponding variable among the N variables that define a withdrawn position and a withdrawn posture of the end effector after retreating the end effector in the holding position and the holding posture from the installation position.

According to this configuration, the value of at least one of the N variables that define the holding position and the holding posture is independent from the value of the corresponding variable among the N variables that define the withdrawn position and the withdrawn posture. Therefore, the withdrawn position and the withdrawn posture can be suppressed to be changed due to the influence of the holding position and the holding posture. As the result, the robot control device according to the present disclosure becomes possible to transfer the substrate appropriately.

Effect of the Disclosure

According to the present disclosure, a robot control device, a robot provided with the same, and a robot system, which can appropriately transfer the substrate, can be provided.

BRIEF DESCRIPTION OF DRAWINGS

FIGS. 4(A) and 4(B) are schematic views in which various contents are added to a partial enlarged view when the end effector of the robot according to the first embodiment of the present disclosure is in a position and a posture of a second teaching point, where FIG. 4(A) is a view in which a locus of the end effector which moves from the first teaching point to the second teaching point is added to the enlarged view, and FIG. 4(B) is a view in which the angular relationship between the center line of the end effector and the perpendicular line drawn toward the opening plane from the central point of the substrate is added to the enlarged view.

FIG. 5(A) is a view in which a locus of the end effector which moves from the first teaching point to the second teaching point is added to the enlarged view, and FIG. 5(B) is a view in which the angular relationship between the center line of the end effector and the perpendicular line drawn toward the opening plane from the central point of the substrate is added to the enlarged view.

FIG. 6 is a table listing values of four variables when the end effector of the robot according to the first and second embodiments of the present disclosure, and an end effector of a conventional robot are in the position and the posture of the first teaching point, and values of four variables when the end effectors are in the position and the posture of the second teaching point.

FIGS. 7(A) and 7(B) are schematic views in which a locus of a moved end effector is added to a partial enlarged view of an end effector of a robot according to a modification of the first embodiment of the present disclosure, where FIG. 7(A) is a view in which the locus of the end effector which moved from the first teaching point to the second teaching point is added to the enlarged view, and FIG. 7(B) is a view in which the locus of the end effector which moved from the second teaching point to the first teaching point is added to the enlarged view.

MODES FOR CARRYING OUT THE DISCLOSURE

First Embodiment

Figure 1:
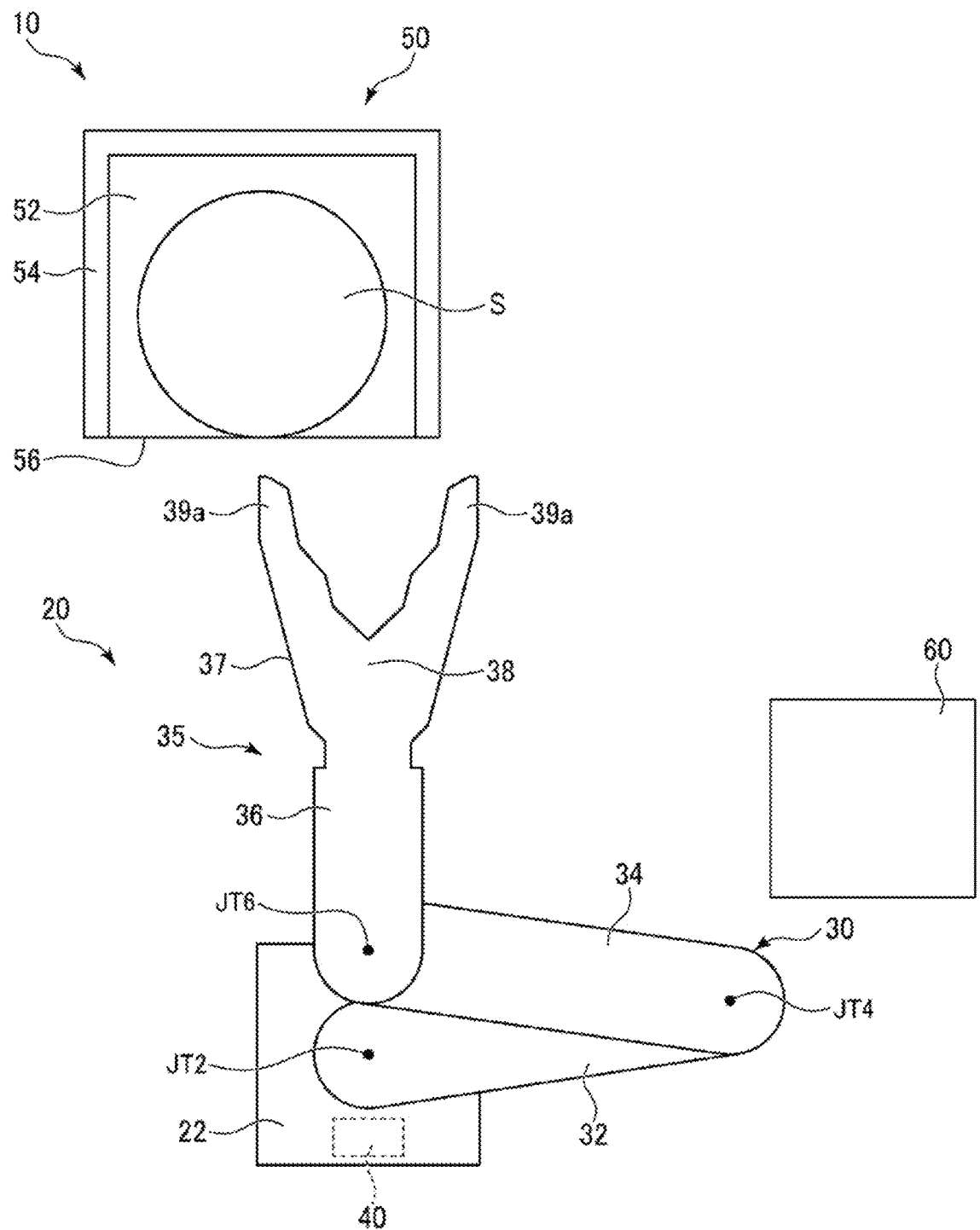
FIG. 1 is a schematic view illustrating the entire configuration of a robot system according to a first embodiment of the present disclosure.

Hereinafter, a robot control device, a robot provided with the same, and a robot system according to a first embodiment of the present disclosure will be described with reference to the drawings. Note that the present disclosure is not necessarily limited by the embodiment. Further, below, throughout the drawings, the same reference characters are assigned to the same or corresponding elements to omit redundant description.

FIG. 1 is a schematic view illustrating the entire configuration of a robot system according to this embodiment. As illustrated in FIG. 1, the robot system 10 according to this embodiment includes a robot 20 for transferring a substrate S while holding the substrate S, and an airtight container 50 for accommodating the substrate S. The robot 20 is disposed adjacent to the airtight container 50 and a processor 60.

(Robot 20)

As illustrated in FIG. 1, the robot 20 is configured as a horizontal articulated robot. The robot 20 includes a base 22, an elevator shaft (not illustrated) which is provided to the base 22 so as to expand and contract in the up-and-down direction, a robotic arm 30 provided to an upper end of the elevator shaft, and an end effector 35 provided to a tip end of the robotic arm. The robot 20 further includes a robot control device 40 for controlling operation of the robotic arm 30 and the end effector 35.

The elevator shaft provided to the base 22 is configured to be expandable and contractible in the up-and-down direction by a ball-screw mechanism (not illustrated). This rise-and-fall operation is performed by a servomotor 24a (see FIG. 2) provided inside the base 22. Further, the elevator shaft is provided to the base 22 so as to be rotatable on a rotation axis extending in the vertical direction, and this rotating operation is performed by a servomotor 24b (same as above) provided inside the base 22.

The robotic arm 30 includes a first link 32 and a second link 34, each comprised of an elongated member extending horizontally.

The first link 32 is attached at a base end in the longitudinal direction to an upper end of the elevator shaft. The first link 32 goes up and down integrally with the elevator shaft, and rotates integrally with the elevator shaft.

The second link 34 is attached at a base end in the longitudinal direction to a tip end of the first link 32 in the longitudinal direction so as to be rotatable on a rotation axis extending in the vertical direction. The rotation of the second link 34 with respect to the first link 32 is performed by a servomotor 34a (see FIG. 2) provided inside the first link 32.

The end effector 35 includes a wrist part 36 attached at a base end in the longitudinal direction to a tip end of the second link 34 in the longitudinal direction so as to be rotatable on a rotation axis extending in the vertical direction, and a base body 37 which is provided to a tip end of the wrist part 36 and operates integrally with the wrist part 36.

The rotation with respect to the second link 34 of the wrist part 36 is performed by a servomotor 35a (see FIG. 2) provided inside the second link 34.

The base body 37 has a base-end part 38 connected to the tip end of the wrist part 36 (a tip end of the robotic arm), and two tip-end parts 39a and 39b which are divided at the base-end part 38 and extend to the tip-end side. The tip-end part 39a projects from the tip-end side of one end of the base-end part 38 in the width direction into a plane perpendicular to the thickness direction, and the tip-end part 39b projects from the tip-end side of the other end of the base-end part 38 in the width direction into the plane perpendicular to the thickness direction. The base body 37 has the base-end part 38 and the tip-end parts 39a and 39b, and therefore, it has a Y-shape when seen in the thickness direction.

For example, the end effector 35 may have a movable member (not illustrated) which is provided to the base-end part 38 and is reciprocatable on the center axis of the end effector 35, and stationary members (same as above) provided to the tip-end parts 39a and 39b, respectively. Further, for example, the end effector 35 may move the movable member to the tip-end side of the center axis, and may hold the substrate S by pinching the substrate S between the movable member and the stationary members.

(Airtight Container 50)

The airtight container 50 includes an installation position 52 where the substrate S is placed, a surrounding member 54 (surrounding part) which surrounds a circumferential edge of the installation position 52, and an opening plane 56 (taking in-and-out plane) formed in the surrounding member 54. The installation position 52 is a position where the substrate S is taken in and out to/from the opening plane 56. The airtight container 50 can open and close the opening plane 56 by an opening and closing member (not illustrated). The airtight container 50 can secure the airtightness of the installation position 52 by the opening member keeping the opening plane 56 in a closed state. For example, the airtight container 50 may be configured as a so-called "FOUP (Front Opening Unified Pod)" that can accommodate a plurality of substrates S which are stacked in the up-and-down direction.

(Processor 60)

For example, the processor 60 is provided in order to apply heat treatment, impurities introduction, thin film formation, lithography, rinsing, and etching, to the substrate S.

(Robot Control Device 40)

Figure 2:
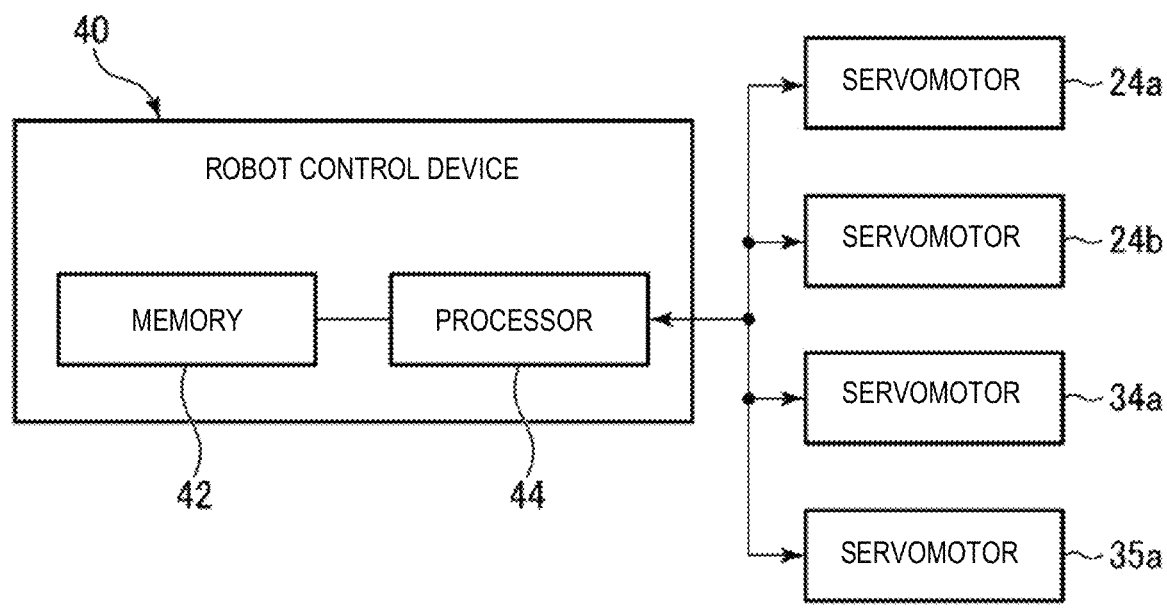
FIG. 2 is a block diagram illustrating a control system of a robot according to the first embodiment of the present disclosure.

FIG. 2 is a block diagram illustrating a control system of the robot according to this embodiment. As illustrated in FIG. 2, a robot control device 40 according to this embodiment includes a memory 42 and a processor 44 for executing a program stored in the memory 42. The processor 44 is connected to each of the servomotors 24a, 24b, 34a, and 35a. The robot control device 40 can servo-control the operation of the robot 20 by using the servomotors 24a, 24b, 34a, and 35a.

Figure 3:
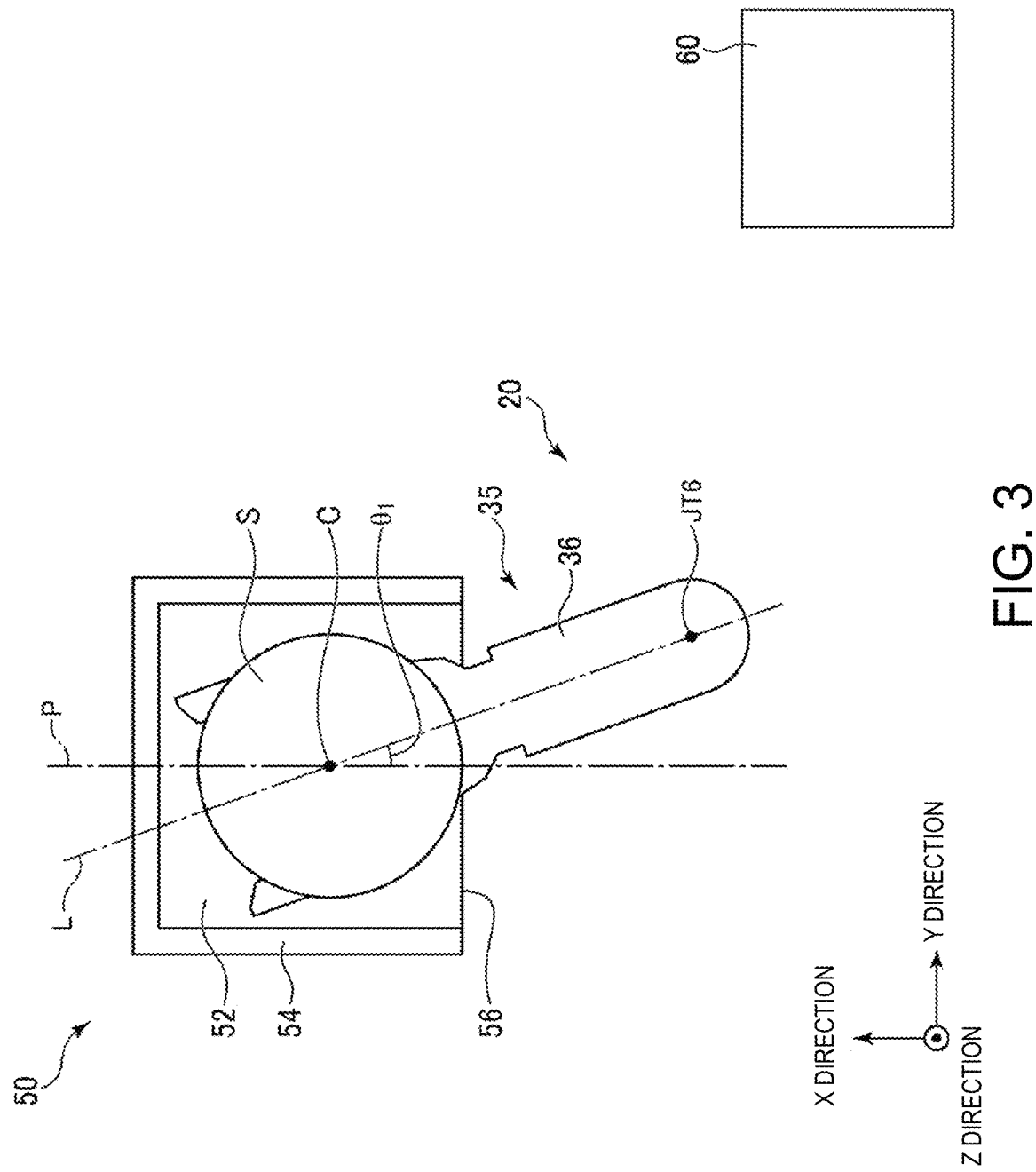
FIG. 3 is a schematic view in which an angular relationship between the center line of an end effector of the robot according to the first embodiment of the present disclosure and a perpendicular line drawn toward an opening plane from the central point of a substrate is added to a partial enlarged view when the end effector is in a position and a posture of a first teaching point.

FIG. 3 is a schematic view in which an angular relationship between the center line of the end effector and a perpendicular line drawn toward the opening plane from the central point of the substrate is added to a partial enlarged view when the end effector of the robot according to this embodiment is in the position and the posture of a first teaching point. Note that, in FIG. 3, components of the robot 20 other than the end effector 35 are omitted in order to avoid complication of the appearance. This is similar in FIGS. 4(A), 4(B), 5(A), 5(B), 7(A) and 7(B) which will be described later.

The robot control device 40 stores beforehand in the memory 42, by teaching, a holding position and a holding posture of the end effector 35 where the end effector 35 can hold the substrate S placed at the installation position 52 (that is, the position and the posture of the end effector 35 illustrated in FIG. 3). The position and the posture of the end effector 35 at this time is referred to as the "first teaching point" of the end effector 35.

Note that the robot control device 40 may store values of four variables (described later) in the memory 42 based on the respective encoder values of the servomotors 24a, 24b, 34a, and 35a in a state where the end effector 35 is actually moved to the first teaching point so that the first teaching point is taught beforehand. Further, a second teaching point (described later) may similarly be taught beforehand to the robot control device 40.

FIGS. 4(A) and 4(B) are schematic views in which various contents are added to a partial enlarged view when the end effector of the robot according to this embodiment is in the position and the posture of the second teaching point, where FIG. 4(A) is a view in which a locus of the end effector which moves from the first teaching point to the second teaching point is added to the enlarged view, and FIG. 4(B) is a view in which the angular relationship between the center line of the end effector and the perpendicular line toward the opening plane drawn from the central point of the substrate is added to the enlarged view.

The robot control device 40 stores beforehand in the memory 42, by teaching, a withdrawn position and an withdrawn posture of the end effector 35 which is provided near the opening plane 56 as a withdrawn position at which the end effector 35 located at the first teaching point is retreated from the installation position 52 (that is, the position and the posture of the end effector 35 illustrated in FIGS. 4(A) and 4(B)). The position and the posture of the end effector 35 at this time are referred to as the "second teaching point" of the end effector 35.

In FIG. 4(A), the substrate S placed at the installation position 52 and the end effector 35 located at the first teaching point are illustrated by broken lines. As illustrated in FIG. 4(A), the robot control device 40 controls operation of the robot 20 between the first teaching point and the second teaching point based on a value derived by an interpolation. In the same drawing, a locus of a joint axis JT6 which moves from the first teaching point to the second teaching point is illustrated by an arrow $AR_1$.

As illustrated in FIG. 4(A), the robot control device 40 controls the operation of the robot 20 between the first teaching point and the second teaching point based on the value derived by the interpolation so that, when seen in the thickness direction of the substrate S placed at the installation position 52, the joint axis JT6 moves linearly and the end effector 35 and the substrate S held by the end effector 35 do not collide with the surrounding member 54 of the airtight container 50 and the processor 60.

Here, the interpolation may be an interpolation for each axis in which joint axes JT2, JT4, and JT6 are each operated by a specified angle, or may be a linear interpolation in which the tip end of the robotic arm 30 is moved straight by making the joint axes JT2, JT4, and JT6 collaborate with each other.

Second Embodiment

FIGS. 5(A) and 5(B) are schematic views in which various contents are added to a partial enlarged view when an end effector of a robot according to a second embodiment of the present disclosure is in the position and the posture of the second teaching point, where FIG. 5(A) is a view in which the locus of the end effector which moves from the first teaching point to the second teaching point is added to the enlarged view, and FIG. 5(B) is a view in which the angular relationship between the center line of the end effector and the perpendicular line drawn from the central point of the substrate toward the opening plane is added to the enlarged view.

In this embodiment, it only differs from the robot system 10 according to the embodiment described above in the mode in which the end effector 35 moves (that is, it only differs from the robot system 10 according to the embodiment described above in the contents stored beforehand in the robot control device 40 by teaching), and the structures of the robot 20, the airtight container 50, and the processor 60 are the same as those in the first embodiment described above. Therefore, the same reference characters are given to the same parts not to repeat similar descriptions.

In FIG. 5(A), the substrate S placed at the installation position 52 and the end effector 35 located at the first teaching point are illustrated by broken lines. As illustrated in FIG. 5(A), the robot control device 40 controls the operation of the robot 20 between the first teaching point and the second teaching point, while maintaining the angle formed between the center line L and the perpendicular line P.

Further, as illustrated in FIG. 5(A), the locus of the joint axis JT6 moving from the first teaching point to the second teaching point is illustrated by an arrow $AR_2$. The robot control device 40 controls the operation of the robot 20 between the first teaching point and the second teaching point so that, when seen in the thickness direction of the substrate S placed at the installation position 52, the joint axis JT6 is moved linearly, and the end effector 35 and the substrate S held by the end effector 35 do not collide with the surrounding member 54 of the airtight container 50 and the processor 60.

The robot control device 40 may control the operation of the robot 20 in the mode described above. Note that, in this embodiment, the robot control device 40 may not store the angle formed between the center line L and the perpendicular line P at the second teaching point.

(Position and Posture of End Effector 35)

Figure 5:
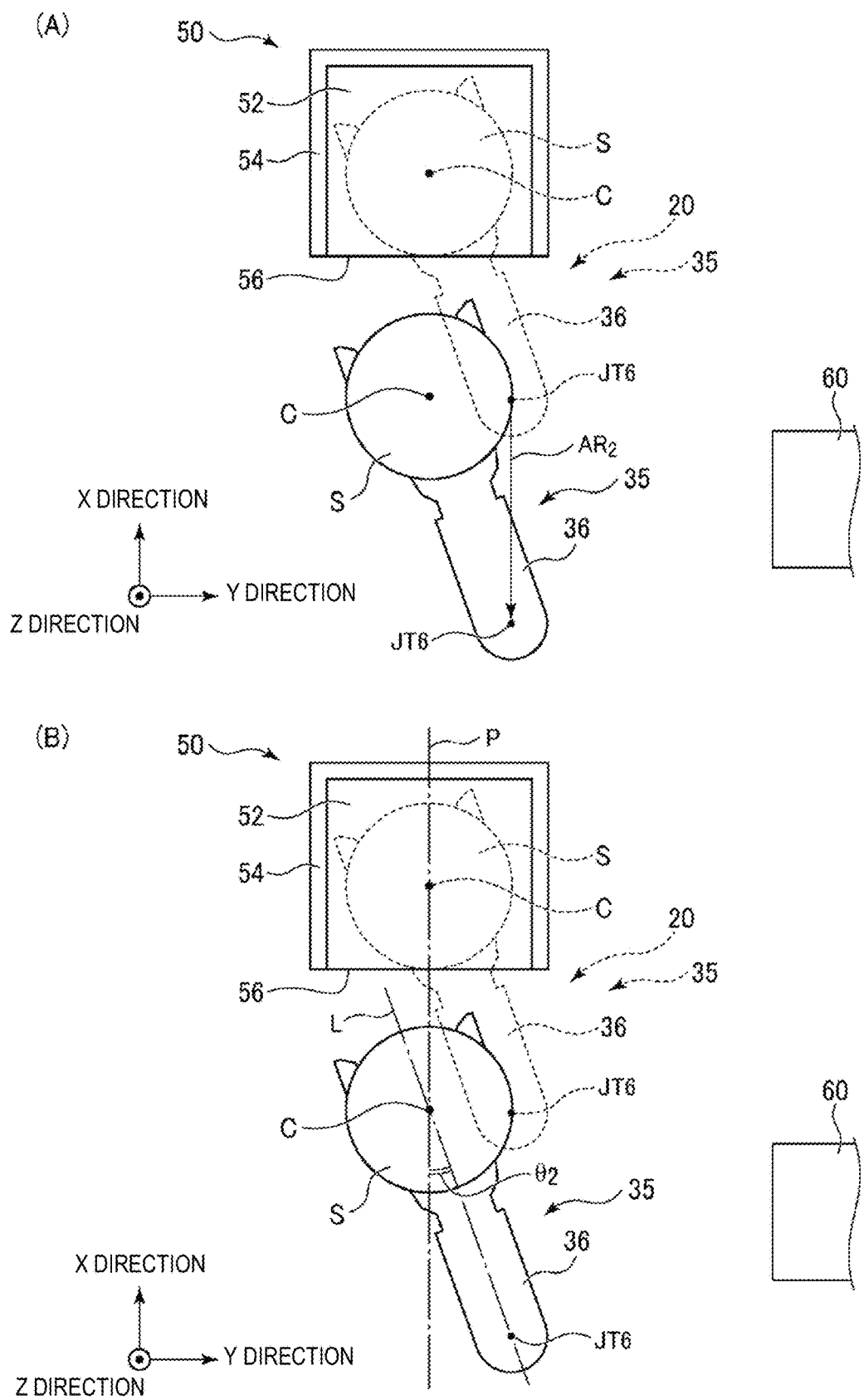
FIGS. 5(A) and 5(B) are schematic views in which various contents are added to a partial enlarged view when an end effector of a robot according to a second embodiment of the present disclosure is in the position and the posture of the second teaching point, where

In the first embodiment described based on FIGS. 3, 4(A), and 4(B), and the second embodiment described based on FIGS. 3, 5(A), and 5(B), the position and the posture of the end effector 35 are defined by values of four variables (values of N variables (N is a natural number)). Here, the position of the end effector 35 is defined by an X-direction component, a Y-direction component, and a Z-direction component, which are illustrated in FIGS. 3 to 5. Further, as illustrated in the same drawings, the posture of the end effector 35 is defined by the angle formed, as seen in the thickness direction of the substrate S placed at the installation position 52, between the center line L of the end effector 35 and the perpendicular line P drawn toward the opening plane 56 from the central point C of the substrate S placed at the installation position 52.

FIG. 6 is a table listing values of four variables when the end effectors of the robot according to the first and second embodiments of the present disclosure, and an end effector of a conventional robot are in the positions and postures of the first teaching point, and values of the four variables when the end effectors are in the positions and the postures of the second teaching point.

As illustrated in FIG. 6, in the first embodiment, an X-direction component value $X_1$ at the first teaching point is independent from an X-direction component value $X_2$ at the second teaching point. Further, a Y-direction component value $Y_1$ at the first teaching point is independent from a Y-direction component value $Y_2$ at the second teaching point. Further, a Z-direction component value $Z_1$ at the first teaching point is independent from a Z-direction component value $Z_2$ at the second teaching point. Moreover, an angle $\theta_1$ (first angle) formed between the center line L and the perpendicular line P at the first teaching point is independent from an angle $\theta_2$ (second angle) formed between the center line L and the perpendicular line P at the second teaching point. Here, the phrase "two values are independent" as used herein refers to that, when one value is changed, the other value is not changed according to the change.

Thus, in the first embodiment, values of all four variables that define the first teaching point of the end effector 35 (that is, the holding position and the holding posture of the end effector 35 illustrated in FIG. 3) are independent from the values of the corresponding variables among the four variables that define the second teaching point of the end effector 35 (that is, the withdrawn position and the withdrawn posture of the end effector 35 illustrated in FIGS. 4(A) and 4(B)), respectively.

As illustrated in FIG. 6, in the second embodiment, the X-direction component value $X_1$ at the first teaching point is independent from the X-direction component value $X_2$ at the second teaching point. On the other hand, the Y-direction component value $Y_1$ at the first teaching point is the same as the Y-direction component value $Y_1$ at the second teaching point. Further, the Z-direction component value $Z_1$ at the first teaching point is the same as the Z-direction component value $Z_1$ at the second teaching point. Moreover, the angle $\theta_1$ (first angle) formed between the center line L and the perpendicular line P at the first teaching point is the same as the angle $\theta_1$ (second angle) formed between the center line L and the perpendicular line P at the second teaching point.

Thus, in the second embodiment, the value $X_1$ of one of the four variables that define the first teaching point of the end effector 35 (that is, the holding position and the holding posture of the end effector 35 illustrated in FIG. 3) is independent from the value $X_2$ of the corresponding variable among the four variables that define the second teaching point of the end effector 35 the point (that is, the withdrawn position and the withdrawn posture of the end effector 35 illustrated in FIGS. 5(A) and 5(B)).

On the other hand, the values $Y_1$, $Z_1$, and $\theta_1$ of the remaining three variables that define the first teaching point of the end effector 35 are the same as the values $Y_1$, $Z_1$, and $\theta_1$ of the remaining three variables that define the second teaching point of the end effector 35. That is, the values $Y_1$, $Z_1$, and $\theta_1$ of the remaining three variables that define the first teaching point of the end effector 35 are not independent from the values of the corresponding variables among the four variables that define the second teaching point of the end effector 35.

Effects

Conventionally, for example, robot control devices which control operation of the robot by deriving the second teaching point based on the first teaching point (hereinafter, referred to as the "conventional robot control device") are known. In detail, the conventional robot control device derives the second teaching point based on the first teaching point and the distance for pulling the tip end of the robotic arm (that is, the end effector) from the first teaching point.

For example, in the conventional example as illustrated in FIG. 6, a value $X_1-200$ of the X-direction component at the second teaching point is derived based on the X-direction component value $X_1$ at the first teaching point. Further, the Y-direction component value $Y_1$ at the first teaching point is the same as the Y-direction component value $Y_1$ at the second teaching point. Further, the Z-direction component value $Z_1$ at the first teaching point is the same as the Z-direction component value $Z_1$ at the second teaching point. Moreover, the angle $\theta_1$ (first angle) formed between the center line L and the perpendicular line P at the first teaching point is the same as the angle $\theta_1$ (second angle) formed between the center line L and the perpendicular line P at the second teaching point.

As described above, according to the conventional robot control device, none of the values of four variables that define the first teaching point of the end effector are independent from the values of the corresponding variables among the four variables that define the second teaching point of the end effector, respectively.

In the conventional robot control device described above, the second teaching point may vary due to the influence of the first teaching point. Thus, for example, when the first teaching point is not taught correctly, even if a problem does not arise at the first teaching point, the end effector or the substrate may collide the airtight container or the processor between the first teaching point and the second teaching point or at the second teaching point, and the robot may not be able to appropriately transfer the substrate.

On the other hand, the robot control device 40 according to the first embodiment described above stores beforehand the first teaching point and the second teaching point by teaching, and the values of all four variables that define the first teaching point of the end effector 35 are independent from the values of the corresponding variables among the four variables that define the second teaching point of the end effector 35, respectively. Therefore, the change in the first teaching point due to the influence of the second teaching point can be suppressed. As the result, the robot control device 40 according to the first embodiment described above becomes possible to transfer the substrate S appropriately.

Further, in the second embodiment described above, the value of one variable $X_1$ among the four variables that define the first teaching point of the end effector 35 is independent from the value of the corresponding variable $X_2$ among the four variables that define the second teaching point of the end effector 35. That is, it becomes possible to precisely teach the operation in the X-direction where the processor 60 exists and the space could be narrow, by making the variable $X_1$ that defines the first teaching point and the variable $X_2$ that defines the second teaching point being mutually independent. In such a mode, the robot control device 40 according to the second embodiment can suppress the change in the first teaching point due to the influence of the second teaching point.

(Modifications)

It is apparent for the person skilled in the art that many improvements and other embodiments of the present disclosure are possible from the above description. Therefore, the above description is to be interpreted only as illustration, and it is provided in order to teach the person skilled in the art the best mode that implements the present disclosure. The details of the structures and/or the functions may be changed substantially, without departing from the spirit of the present disclosure.

In the first embodiment described above, the case where the values of all four variables that define the first teaching point of the end effector 35 are independent from the values of the corresponding variables among the four variables that define the second teaching point of the end effector 35, respectively, is described. Further, in the second embodiment described above, the case where the value of one variable $X_1$ among the four variables that define the first teaching point of the end effector 35 is independent from the value of the corresponding variable $X_2$ among the four variables that define the second teaching point of the end effector 35, is described. However, it is not limited to these cases, as long as the value of at least one of the four variables that define the first teaching point of the end effector 35 is independent from the value of the corresponding variable among the four variables that define the second teaching point of the end effector 35.

In the embodiments described above, the position and the posture of the end effector 35 are defined by the values of four variables. However, it is not limited to this case, but the position and the posture of the end effector 35 may be defined based on values of N variables (N is a natural number) other than four.

In the embodiments described above, since the robot 20 has one elevator shaft and three joint axes JT2, JT4, and JT6, a degree of freedom of the hand of the robotic arm 30 is 4, and this number is the same as the number of variables that define the position and the posture of the end effector 35. Therefore, it can be prevented that the structure of the robotic arm 30 becomes redundant. However, it is not limited to this case, but the robot 20 may have one elevator shaft and four or more joint axes to have the degree of freedom of the hand of the robotic arm 30 being five or more so that this number may be larger than the number of variables that define the position and the posture of the end effector 35.

In the embodiments described above and its modifications, the airtight container 50 is configured to be the so-called "FOUP." However, it is not limited to this case, but, for example, the airtight container 50 may be a load lock apparatus which switches between a vacuum state and an atmosphere state, an alignment apparatus which performs an alignment of the substrate S, or a treatment apparatus which performs processing, such as resist application, to the substrate S.

Alternatively, an aligner which adjusts a rotational position of the substrate S may be provided, instead of the airtight container 50. Further, the installation position 52 of the aligner may be exposed. That is, the aligner may not be provided with the configuration equivalent to the surrounding member 54 of the airtight container 50, but may be provided with a taking in-and-out plane as the configuration equivalent to the opening plane 56 of the airtight container 50.

In the embodiments described above, the end effector 35 holds the substrate S by pinching the substrate S between the movable member (not illustrated) provided to the base-end part 38 thereof and reciprocatable on the center line of the base body 37, and the stationary members (same as above) provided to the tip-end parts 39*a* and 39*b*, respectively. However, it is not limited to this case, but the end effector 35 may hold the substrate S by placing the substrate S thereon or sucking the substrate S.

In the embodiments described above, the robot control device 40 controls the operation of the robot 20 between the first teaching point and the second teaching point based on the value derived by the interpolation so that the joint axis JT6 is moved linearly when seen in the thickness direction of the substrate S placed at the installation position 52. However, it is not limited to this case, but the robot control device 40 may control the operation of the robot 20 between the first teaching point and the second teaching point based on the value derived by the interpolation so that the joint axis JT6 is moved to be bent or in an arc shape, as long as the end effector 35 and the substrate S held by the end effector 35 do not collide with the surrounding member 54 of the airtight container 50 and the processor 60.

In the embodiments described above, the robot control device 40 is taught beforehand about the first teaching point and the second teaching point, by storing the values of four variables in the memory 42 based on the respective encoder values of the servomotors 24*a*, 24*b*, 34*a*, and 35*a* in the state where the end effector 35 is actually moved to the first teaching point and the second teaching point. However, it is not limited to this case, but the robot control device 40 may be taught beforehand about the first teaching point and the second teaching point by storing the values of four variables in the memory 42 based on information on an ideal position and an ideal posture when the end effector 35 is moved to the first teaching point and the second teaching point (for example, information on the position and the posture on CAD (Computer Aided Design)).

Alternatively, the robot control device 40 may store the values of four variables in the memory 42 based on the respective encoder values of the servomotors 24*a*, 24*b*, 34*a*, and 35*a* in the state where the end effector 35 is actually moved to either one of the first teaching point and the second teaching point. In addition, the robot control device 40 may derive the values of four variables of the end effector 35 which is moved to the other of the first teaching point and the second teaching point, based on the four variables stored in the memory 42.

That is, in the stage where the four variables of each of the first teaching point and the second teaching point are stored or derived, the value of at least one of the four variables that define the first teaching point of the end effector 35 is stored or derived based on the value of the corresponding variable among the four variables that define the second teaching point of the end effector 35. Moreover, the value of at least one of the four variables that define the second teaching point of the end effector 35 is stored or derived based on the value of the corresponding variable among the four variables that define the first teaching point of the end effector 35. Even in such a case, when the value of at least one of the four variables that define the first teaching point of the end effector 35 is changed, the value of the corresponding variable among the four variables that define the second teaching point of the end effector 35 is configured not to be changed according to the change. Therefore, the value of at least one of the four variables that define the first teaching point of the end effector 35 can be made independent from the value of the corresponding variable among the four variables that define the second teaching point of the end effector 35.

Further, the robot control device 40 may be taught beforehand about the first teaching point and the second teaching point by combining the three modes described in the embodiments described above and its modifications.

FIGS. 7(A) and 7(B) are schematic views in which the locus of the end effector which moved is added to a partial enlarged view of the end effector of the robot according to the modification of the first embodiment, where FIG. 7(A) is a view in which the locus of the end effector which moved from the first teaching point to the second teaching point is added to the enlarged view, and FIG. 7(B) is a view in which the locus of the end effector which moved from the second teaching point to the first teaching point is added to the enlarged view.

In FIG. 7(A), the end effector 35 located at the first teaching point is illustrated by broken lines, and the end effector 35 located at the second teaching point is illustrated by solid lines. Further, a locus of the joint axis JT6 which moves from the first teaching point to the second teaching point is illustrated by an arrow AR$_1$'. As illustrated in FIG. 7(A), the first teaching point may be a teaching point of the end effector 35 at which the substrate S held by the end effector 35 is placeable at the installation position 52.

In FIG. 7(B), the end effector 35 located at the second teaching point is illustrated by broken lines, and the end effector 35 located at the first teaching point is illustrated by solid lines. Further, the locus of the joint axis JT6 which moves from the second teaching point to the first teaching point is illustrated by an arrow AR$_1$". As illustrated in FIG. 7(B), the second teaching point may be a teaching point of the end effector 35, which is provided near the opening plane 56 as the withdrawn position before inserting the end effector 35 from the opening plane 56 and making it located at the first teaching point.

Note that the first teaching point may be a teaching point of the end effector 35 where the substrate S held by the end effector 35 is placeable at the installation position 52, and the second teaching point may be a teaching point of the end effector 35 provided near the opening plane 56 as the withdrawn position before inserting the end effector 35 from the opening plane 56 and making it located at the first teaching point.

CONCLUSION

The robot control device according to the present disclosure is the robot control device configured to control operation of the robot configured to transfer the substrate while holding the substrate. The robot includes the robotic arm having at least one joint axis, and the end effector provided to the tip end of the robotic arm and configured to hold the substrate. The robot is disposed adjacent to the installation position at which the substrate is placed. The position and the posture of the end effector are defined by the values of N variables (N is a natural number). The value of at least one of the N variables that define the holding position and the holding posture of the end effector for holding the substrate placed on the installation position by the end effector is independent from the value of the corresponding variable among the N variables that define the withdrawn position and the withdrawn posture of the end effector after retreating the end effector in the holding position and the holding posture from the installation position.

According to this configuration, the value of at least one of the N variables that define the holding position and the holding posture of the end effector is independent from the value of the corresponding variable among the N variables that define the withdrawn position and the withdrawn posture. Therefore, the withdrawn position and the withdrawn posture can be suppressed to be changed due to the influence of the holding position and the holding posture. As the result, the robot control device according to the present disclosure becomes possible to transfer the substrate appropriately.

A degree of freedom of a wrist of the robotic arm may be N.

The values of all the N variables that define the holding position and the holding posture may be independent from the values of the corresponding variables among the N variables that define the withdrawn position and the withdrawn posture, respectively.

The installation position may be a position where the substrate is taken in and out of the taking in-and-out plane. At least one of the first angle formed, as seen in the thickness direction of the substrate placed on the installation position, between the center line of the end effector and the perpendicular line drawn toward the taking in-and-out plane from the central point of the substrate placed on the installation position when the end effector is in the holding position and the holding posture, and the second angle formed, as seen in the thickness direction, between the center line of the end effector and the perpendicular line when the end effector is in the withdrawn position and the withdrawn posture, may be stored beforehand by teaching.

The first and second angles may be stored beforehand by teaching. The operation of the robot between the first teaching point and the second teaching point may be controlled based on the value derived by the interpolation.

The first angle and the second angle may be the same. The device may control the operation of the robot between the first teaching point and the second teaching point while maintaining the first angle.

The robot according to the present disclosure includes the robot control device having any one of configurations described above, the robotic arm, and the end effector.

According to this configuration, since the robot control device having any one of configurations described above is provided, the substrate can be transferred appropriately.

The robot may be configured to be the horizontal articulated robot.

A robot system according to the present disclosure includes the robot having either of configurations described above and an installation device having the installation position.

According to this configuration, since the robot having either of configurations described above is provided, the substrate can be transferred appropriately.

The installation device may have the surrounding part surrounding at least a part of the circumferential edge of the installation position, and the opening plane formed in the surrounding part, and may be an airtight container which is openable and closable of the opening plane.

DESCRIPTION OF REFERENCE CHARACTERS

10 Robot System
20 Robot

22 Base
30 Robotic Arm
32 First Link
34 Second Link
35 End Effector
36 Wrist Part
37 Base Body
38 Base-end Part
39 Tip-end Part
40 Robot Control Device
42 Memory
44 Processor
50 Airtight Container
52 Installation Position
54 Surrounding Member
56 Opening Plane
60 Processor
L Center Line of End Effector
P Perpendicular Line Drawn toward Opening Plane from Central Point of Substrate
S Substrate
C Central Point
JT Joint Axis
θ Angle
AR Arrow

What is claimed is:

1. A robot configured to transfer a substrate while holding the substrate, the robot comprising:
   a robotic arm having at least one joint axis; and
   an end effector provided to a tip end of the robotic arm and configured to hold the substrate,
   wherein the robot is disposed adjacent to an installation position at which the substrate is placed, and the installation position is a position where the substrate is taken in and out of a taking in-and-out plane,
   wherein a position and a posture of the end effector are defined by an X direction value, a Y direction value, a Z direction value, and an angle formed, as seen in a thickness direction of the substrate placed on the installation position, between a center line L of the end effector and a perpendicular line P drawn toward the taking in-and-out plane from a central point of the substrate placed on the installation position when the end effector is in a holding position and a holding posture, and
   wherein a first X direction value, a first Y direction value, a first Z direction value, and a first angle between the center line L and the perpendicular line P that define the holding position and the holding posture of the end effector for holding the substrate placed on the installation position by the end effector are all different from respective second X direction value, second Y direction value, second Z direction value, and second angle between the center line L and the perpendicular line P that define a withdrawn position and a withdrawn posture of the end effector after retreating the end effector in the holding position and the holding posture from the installation position.

2. The robot of claim 1, wherein a degree of freedom of a wrist of the robotic arm is N.

3. The robot of claim 1, wherein
   a robot control device controls operation of the robot between a first teaching point and a second teaching point based on a value derived by an interpolation.

4. The robot of claim 1, wherein the robot is a horizontal articulated robot.

5. A robot system comprising the robot of claim 1, and an installation device having the installation position.

6. The robot system of claim 5, wherein the installation device has a surrounding part surrounding at least a part of a circumferential edge of the installation position, and an opening plane formed in the surrounding part, and
   wherein the installation device is configured to be an airtight container openable and closable of the opening plane.

* * * * *